United States Patent
Singh et al.

(10) Patent No.: US 11,105,843 B2
(45) Date of Patent: Aug. 31, 2021

(54) ROBUST ARCHITECTURE FOR MODE SWITCHING OF A FORCE AND MEASURE APPARATUS

(71) Applicant: Analog Devices International Unlimited Company, Limerick (IE)

(72) Inventors: Amit Kumar Singh, Woburn, MA (US); Christopher C. McQuilkin, Hollis, NH (US)

(73) Assignee: Analog Devices International Unlimited Company, Limerick (IE)

( * ) Notice: Subject to any disclaimer, the term of this patent is extended or adjusted under 35 U.S.C. 154(b) by 186 days.

(21) Appl. No.: 16/598,962

(22) Filed: Oct. 10, 2019

(65) Prior Publication Data
US 2021/0109151 A1   Apr. 15, 2021

(51) Int. Cl.
*G01R 31/28* (2006.01)
*H03F 3/45* (2006.01)

(52) U.S. Cl.
CPC ...... *G01R 31/2834* (2013.01); *H03F 3/45179* (2013.01); *H03F 2203/45028* (2013.01)

(58) Field of Classification Search
CPC ........... G01R 31/2834; G01R 31/2879; H03F 2203/45028; H03F 3/45179; H03F 2200/261; H03F 3/3018; H03F 3/45475; H03F 3/45192
USPC .................................. 324/750.01, 537, 500
See application file for complete search history.

(56) References Cited

U.S. PATENT DOCUMENTS

| | | |
|---|---|---|
| 4,092,589 A | 5/1978 | Chau et al. |
| 4,456,880 A | 6/1984 | Warner et al. |
| 5,059,889 A | 10/1991 | Heaton |
| 5,754,041 A | 5/1998 | Kaito et al. |
| 6,657,455 B2 | 12/2003 | Eldridge et al. |
| 7,187,194 B2 | 3/2007 | Robertazzi |
| 7,292,044 B2 | 11/2007 | Frame |
| 7,403,030 B2 | 7/2008 | Walker et al. |
| 9,923,410 B2 | 3/2018 | Schaedlich |
| 2019/0067056 A1* | 2/2019 | Shen .................. G01R 31/2858 |

(Continued)

FOREIGN PATENT DOCUMENTS

| | | |
|---|---|---|
| CN | 102931669 A | 2/2013 |
| EP | 1701174 B1 | 4/2008 |

(Continued)

OTHER PUBLICATIONS

"AD5520: Per Pin Parametric Measurement Unit/Source Measure Unit", ADI Datasheet, (2005), 24 pgs.

(Continued)

*Primary Examiner* — Giovanni Astacio-Oquendo
(74) *Attorney, Agent, or Firm* — Schwegman Lundberg & Woessner, P.A.

(57) ABSTRACT

A stabilization technique is disclosed that suppresses or inhibits glitching behavior on automated test equipment (ATE) during mode transitions. Adjustable stabilizing circuitry can be coupled to at least one of a force voltage circuit or a force current circuit is forcing voltage or current to a device under test (DUT). The adjustable stabilizing circuitry can be adjustably configurable in response to whether at least one of a current clamp or a voltage clamp is in an active clamping mode. In this manner, unwanted glitching behavior associated with mode changes can be reduced or suppressed.

20 Claims, 6 Drawing Sheets

(56) References Cited

U.S. PATENT DOCUMENTS

| | | | |
|---|---|---|---|
| 2019/0107569 A1 | 4/2019 | Kidd et al. | |
| 2020/0309849 A1* | 10/2020 | Messier | G01R 31/2879 |
| 2020/0400751 A1* | 12/2020 | Weeman | G01R 35/005 |

FOREIGN PATENT DOCUMENTS

| | | |
|---|---|---|
| JP | H11133068 A | 5/1999 |
| JP | 2010127820 A | 6/2010 |
| JP | 2011226883 A | 11/2011 |
| WO | WO-2018177535 A1 | 10/2018 |
| WO | WO-2018177536 A1 | 10/2018 |

OTHER PUBLICATIONS

Collins, Edward, "A Design Approach and Integration of a Parametric Measurement Unit onto a 600MHz DCL", Masters Thesis at Northeastern University, Boston, MA, (Sep. 2010), 110 pgs.

\* cited by examiner

ROBUST ARCHITECTURE FOR MODE SWITCHING OF A FORCE AND MEASURE APPARATUS

TECHNICAL FIELD

The present disclosure relates to systems and methods to force voltage or current to a device under test (DUT), and more particularly, to a method of forcing and stabilizing voltage or current delivered to the DUT.

BACKGROUND

When testing electronic components such as an integrated circuit or other similar semiconductor device, a device under test (DUT) (e.g. a pin of a DUT) can be placed in hardware to provide an interface between the DUT and circuitry comprising automated test equipment (ATE). Generally, ATE circuitry can be used to provide stimulus (e.g. a voltage or a current) to be applied to the DUT, such as to a single terminal or multiple terminals (e.g., pins) of the DUT. Such automated test equipment allows the connection system to perform measurements on, or diagnose faults in, the DUT, such as by monitoring a response to such stimulus.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
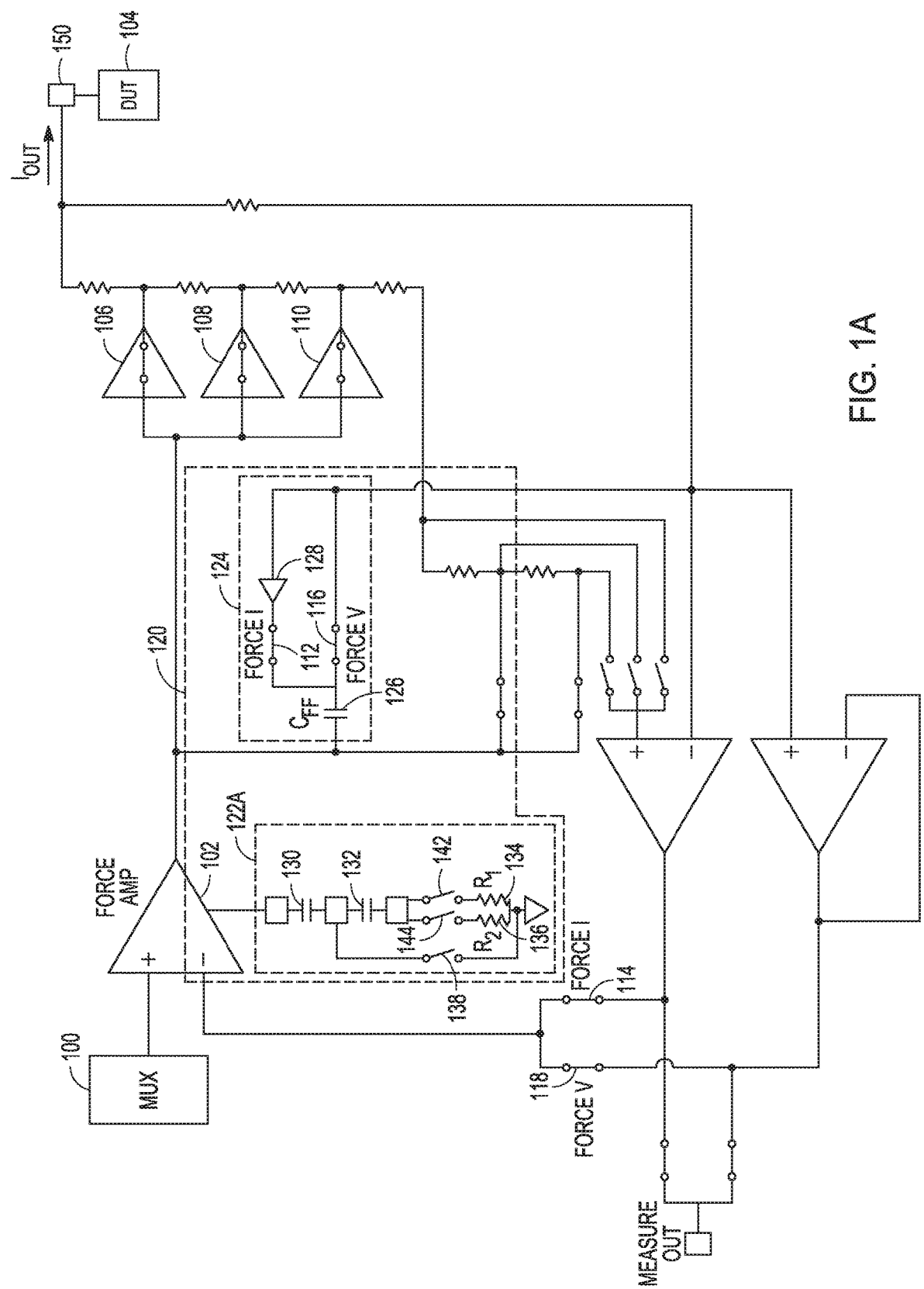
FIG. 1A illustrates an example that can include pre-charge circuitry, stabilizing circuitry, and a compensation network connected to, or included as a portion of, a per-pin parametric measurement unit (PPMU).

Automated test equipment (ATE), such as a including a "per pin parametric measurement unit" (PPMU), can provide different modes of operation. For example, such ATE can provide a force current mode or a force voltage mode providing a specified voltage or current to be forced to one node or multiple nodes of a device under test (DUT). For example, such nodes can include respective pins of an integrated circuit or other electrical component. The force voltage mode can be implemented using a force voltage feedback circuit. Likewise, the force current mode can be implemented using a force current feedback circuit. The force voltage feedback circuit and force current feedback circuit may each have their own, independent, loop dynamics (e.g. gain, transient response, or bandwidth).

Use of a PPMU facilitates generation of a wide range of controlled current or voltage values that can be applied, such as to implement different test applications or scenarios. As an illustrative example, a selectable current value can be provided from a selectable current range of a PPMU. For example, the range can include values defined by a span of plus-or-minus 2 microamperes ($\mu A$), defining a first range, to plus-or-minus 40 milliamperes (mA), defining a second range. As an illustrative example, a voltage value can be provided, selected from a range spanning plus-or-minus 5 volts. In another example, the voltage range may be −1.5 volts to 6.5 volts. A current value within the first range may be used, for example, when evaluating a leakage current, and a current value within the second range may be used when characterizing circuitry having relatively high-power device supply pins. The ranges mentioned above are illustrative, and ATE having a PPMU can include use of other ranges or values in a force voltage mode or a force current mode.

During operation, ATE may switch between the force current and the force voltage modes. Such mode switching can result in an undesirable glitch on the node or nodes under test. For example, such glitching behavior can include a voltage or current transient that was not intended, or a temporal instability (e.g., oscillation or "ringing"). Such glitches may cause, for example, protective voltage or current clamps to be triggered, or unwanted "ringing" until the current or voltage stabilizes. Such glitching behavior may even result in damage to the DUT or initiate an undesired transition, particularly if the glitch results in a value of a voltage or a current to move outside a specified range or to cross a specified threshold. For example, a glitch may cause an unwanted transition from a low logic level to a high logic level or from a high logic level to a low logic level, or a series of such transitions.

The present inventors have recognized, among other things, that suppression of such glitching behavior can enhance performance of ATE, such as providing a PPMU that reduces or suppresses glitching behavior during mode transitions. This may be accomplished, for example, by initializing stabilizing circuitry coupled to the ATE for glitch free mode transitions. The present inventors have also recognized that adjustable stabilizing circuitry can be coupled to at least one of the force voltage circuit or the force current circuit. For example, such stabilizing circuitry can be adjustably configurable in response to whether at least one of a current clamp or a voltage clamp is in an active clamping mode. In this manner, unwanted glitching behavior associated with mode changes can be reduced or suppressed.

In an example, clamping may be accomplished using the circuitry comprising at least one of the force current feedback loop or the force voltage feedback loop, which may switch in voltage clamping circuitry or current clamping circuitry connected to the DUT. The adjustable stabilizing circuitry may include, for example, a compensation network that is switched in during at least one of: (1) a force voltage operating mode or (2) a force current operating mode, such as in which the voltage clamp is operating in an active clamping mode. In another example, the compensation network may be switched when the circuit is operating in force-voltage mode and current clamping activates. In an example, the compensation network may include a feedforward capacitor. In another example, the compensation network may include a capacitor coupled to a resistor-inductor network.

As an illustrative example, when the system is operating in a force current mode with the voltage clamp engaged, a first switch closes connecting the first resistor to the capacitor. Similarly, when the system is operating in a force-voltage mode with the current clamp engaged, a second switch closes connecting the second resistor to the capacitor.

The system may include precharge circuitry configured to initialize at least a portion of the stabilizing circuitry for mode switching the stabilizing circuitry between operating modes. In an example the pre-charge circuitry may include a capacitor and a reverse buffer to charge the capacitor based on a voltage at the output node. For example, when in a force current mode (or a force voltage mode with the current clamp engaged), a feed forward path including the capacitor is isolated from the PPMU, but can be pre-charged through the reverse buffer. When operating in a force voltage mode, or in a force current mode with the voltage clamp engaged, the feed forward path including the capacitor is enabled, and the reverse buffer is switched out and disengaged.

The role of the capacitor is for stabilizing the circuit, by canceling or reducing the effect of a non-dominant pole by placing a zero. A force voltage switch may be placed in series with the capacitor to ensure that the capacitor is only switched in when operating in force voltage mode, or when the voltage is being clamped while in force current mode.

In accordance with a second aspect of the disclosure, there is provided a method for forcing a voltage or a current delivered to an output node for coupling to a device under test (DUT) and measuring the other of the voltage or current at the DUT, the method comprising: forcing one of a voltage or a current at the output node, stabilizing at least one of the forced current or the force voltage using adjustable stabilizing circuitry in response to whether at least one of voltage clamping or current clamping is occurring at the output node, and initializing at least a portion of the stabilizing circuitry for mode switching the stabilizing circuitry between operating modes.

A multiplexer coupled to a force amplifier can be used to force one of a voltage or current at the output node may be accomplished by using a multiplexer coupled to a force amplifier or buffer. For example, the multiplexer can pass a voltage or current level within a range of voltage or current to the output node. A buffer may be connected between the force amplifier and the output node, which can support different current ranges which can be selected to pass to the output node, such as, for example one or more of a first current range with a target of ±40 (milliamperes) mA, a second current range with a target of ±1 mA, a third current range with a target of ±100 (microamperes) μA, a fourth current rage with a target of ±10 μA, or a fifth current range with a target of ±2 μA.

Pre-charge circuitry can be used to stabilize at least one of the forced current or the force voltage using adjustable stabilizing circuitry in response to whether at least one of voltage clamping or current clamping is occurring at the output node. This may be accomplished, for example, using pre-charge circuitry, as a part of a compensation network that is switched in during at least one of: (1) a force voltage operating mode or (2) a force current operating mode in which the voltage clamp is operating in an active clamping mode. The pre-charge circuitry may include a feed forward capacitor, the feed forward capacitor connected to a reverse buffer to charge the capacitor based on a voltage at the output node. In another example, the pre-charge circuitry may include a capacitor coupled to a resistor or an inductor, or a capacitor-resistor-inductor series connected network.

The adjustable stabilizing circuitry may comprise a switched resistor-capacitor network coupled to a compensation node of the force amplifier or buffer. Said resistor-capacitor network may include a capacitor connected to a first switch and a second switch. The first switch connected to a first resistor, and the second switch connected to a second resistor. For example, when the system is operating in a in a force current mode with the voltage clamp engaged, the first switch closes connecting the first resistor to the capacitor. Similarly, when the system is operating in a force voltage mode with the current clamp engaged, the second switch closes connecting the second resistor to the capacitor.

The reverse buffer can charge the feed-forward capacitor to initialize at least a portion of the stabilizing circuitry for mode switching the stabilizing circuitry between operating modes. For example, when the system is operating in the force current mode, a force current switch, connected to a force current circuit is closed and a force voltage switch open, charging the capacitor. Responsive to the voltage being clamped, the force current switch opens and the force voltage switch closes connecting the capacitor to the stabilizing circuitry.

Connecting the pre-charged capacitor to the stabilizing circuitry may reduce, inhibit, or minimize voltage spikes or other similar glitches which may be caused by switching between operating modes of a PPMU. Such glitches or spikes may result in damage to, or otherwise degrade the performance of the DUT. For example, ringing or oscillation which may occur on a DUT pin when switching from force current to force voltage mode before settling at a final value.

FIG. 1A illustrates an example that can include pre-charge circuitry, stabilizing circuitry, and a compensation network connected to, or included as a portion of, a per-pin parametric measurement unit (PPMU). In an example, the PPMU is comprised of a multiplexer 100 connected to a force amplifier or buffer 102. The multiplexer 100 allows a selected voltage or current, from a range of voltage (e.g. from −1.5 volts to 6.5 volts) to be passed or forced to the device under test (DUT) 104. The PPMU can include buffers 106, 108, and 110. One or more of buffer circuits 106, 108, or 110, can be switched in to establish or support a specified output current range. In another example, current ranges can be selected by via a switch as described below.

Force current switches 112 and 114 can be closed and force voltage switches 116 and 118 can be open to establish a force-current mode, including a current feedback path. Conversely, when the circuit is operating in force-voltage mode, force voltage switches 116 and 118 are closed, and force current switches 112 and 114 are open, creating a force voltage circuit, including a voltage feedback path. Further, the circuitry making up the force current feedback loop and the force voltage feedback loop may also enable a current clamp or a voltage clamp depending on whether the circuitry is operating in a force voltage or a force current mode. In an example, the voltage clamp and current clamp may be comprised of additional circuitry (not shown) connected to the DUT 104 which can be switched in or out by the force voltage switches 116 and 118, or the force current switches 112 and 114.

The PPMU can transition between a force current mode of operation and a force voltage mode of operation, such as by adjusting the respective states of the force voltage switches 116 and 118, and the force current switches 112 and 114. When transitioning between modes, a voltage spike or other glitch may occur on a node coupled to the DUT. For example, the voltage clamp or the current clamp may be triggered transiently or cyclically, causing a "ringing" or other transient waveform, until the current or voltage stabilizes as it approaches a steady-state value. For example, such behavior is shown in an illustrative example in FIG. 2 as described below.

Referring back to FIG. 1A, compensation network 120 may include stabilizing circuitry 122 and pre-charge circuitry 124. The compensation network 120 may be coupled to the PPMU via the force amplifier or buffer 102. Such a compensation network 120 can, at least in part, establish a voltage feedback path or a current feedback path, such as depending on respective states of the force current switches 112 and 114, or the force voltage switches 116 and 118. In a non-limiting example, the pre-charge circuitry 124, may include a feed-forward capacitor 126, a reverse buffer 128, a force current switch 112, a force voltage switch 116, as illustrative examples.

Figure 1B:
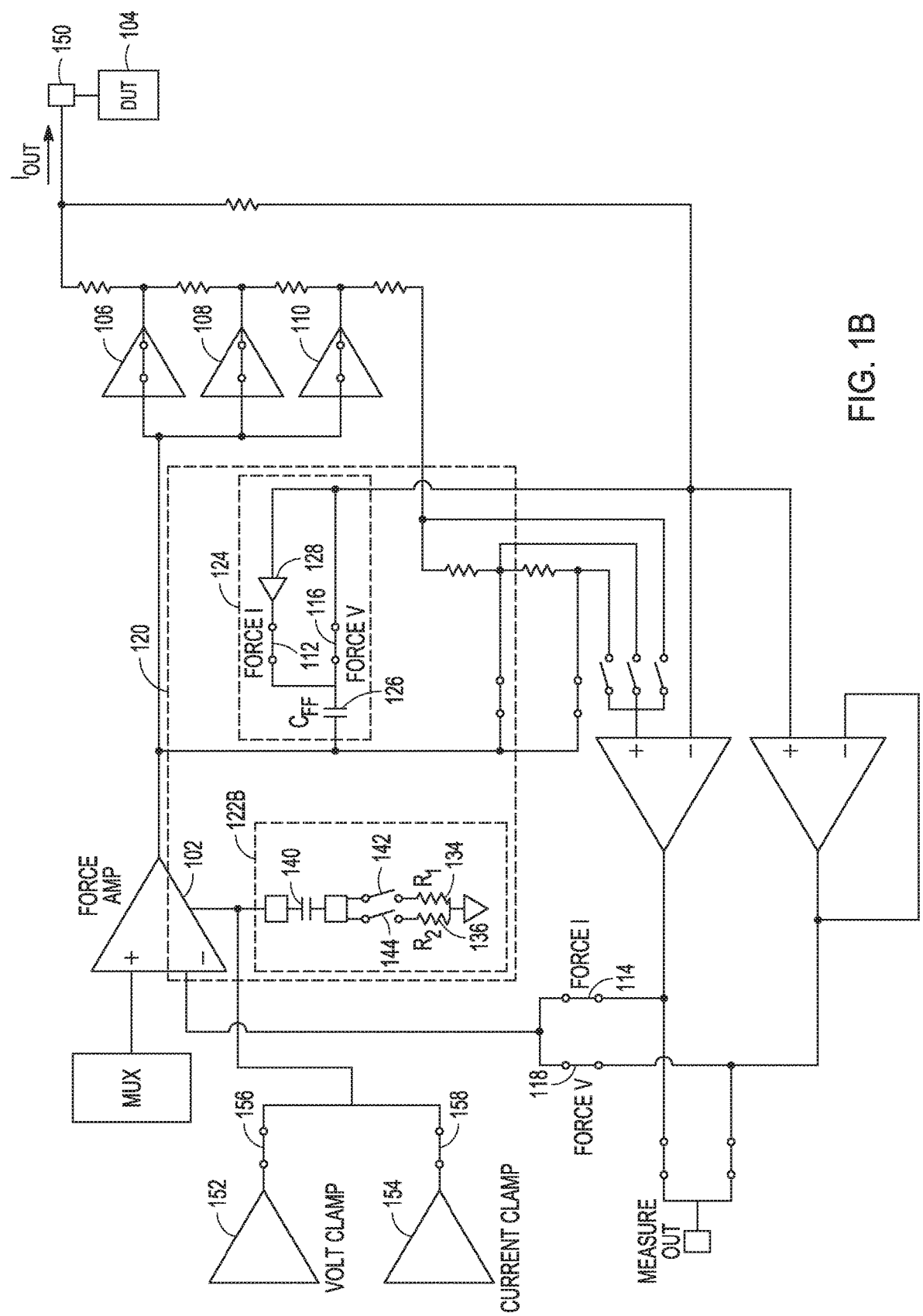
FIG. 1B illustrates another example that can include pre-charge circuitry, stabilizing circuitry, and a compensation network connected, or included as a portion of, a per-pin parametric measurement unit (PPMU).

The stabilizing circuitry 122A, as a non-limiting example, may include a resistor-capacitor network coupled to a compensation node of the force amplifier or buffer 102. The stabilizing circuitry 122A may comprise a first capacitor 130 (e.g. 3.7 nano-farad (nF) capacitor), a second capacitor 132 (e.g. a 1.4 nano-farad (nF) capacitor), a first resistor $R_1$ 134, a second resistor $R_2$ 136, a bypass switch 138, or the like. Capacitor 132 (e.g. a 1.4 nF capacitor) may be switchably connected, using switches 142 or 144, to a particular one of the resistors 134 and 136 responsive to the voltage clamp activating or the current clamp activating. Bypass switch 138, may be used to connect a higher capacitive load (e.g. 3.7 nF) to the DUT 104. The compensation network 120, the pre-charge circuitry 124, and the stabilizing circuitry 122, may include more or less components, such as, for example, as shown in FIG. 1B and described below.

Referring back to FIG. 1A, switching between force voltage and force current modes will cause the feed-forward capacitor 126 to be switched in and out. For example, the feed-forward capacitor 126 may be switched into the feedback circuit by closing the force voltage switch 116 which is connected in series with the feed-forward capacitor 126. In another example, the feed-forward capacitor 126 may be switched into the circuit when the circuit is operating in force current mode when voltage clamping activates, and the force voltage switch 116 closes. This may occur when a voltage on a pin of the DUT 102 falls outside a specified range (e.g. exceeds an upper threshold or falls below a lower threshold (the upper and lower thresholds defining the specified range)) when the circuit is operating in force current mode. Closing force voltage switch 116 and force voltage switch 118 when the voltage clamp activates can ensure stability in the circuit (e.g. prevent oscillation, phase shift, or the like).

The feed-forward capacitor 126 may store an unwanted charge if the feed-forward capacitor 126 is left floating. During a mode transition, such an unwanted charge may be injected or otherwise discharged in a manner causing glitching or otherwise transient behavior as mentioned above. To prevent this, it is helpful to keep the feed-forward capacitor 126 pre-charged using a reverse buffer 128. The reverse buffer 128 may prevent forward current flow, blocking feed forward action, allowing the feed-forward capacitor 126 to charge, even when force voltage switch 116 is open. Thus, the feed-forward capacitor 126 will retain a charge when switching between force voltage and force current mode, whether the mode switching is intentionally initiated or caused because voltage clamping, or current clamping activates. The charge on the feed-forward capacitor 126 may be based on a voltage at an output node 150.

When the circuit is operating in force current mode (or force voltage mode with current clamps engaged), force current switches 112 and 114 are closed, and force voltage switches 116 and 118 are open. When the voltage on the high-in pin of the force amplifier or buffer 102 is outside a range, capacitor 130 may be switched to resistor $R_1$ 134 or $R_2$ 136, using switches 142 and 144, so as to pull the voltage up or down so as to move the voltage level back into the range.

FIG. 1B illustrates another example that can include pre-charge circuitry, stabilizing circuitry, and a compensation network connected, or included as a portion of, a per-pin parametric measurement unit (PPMU). In an example, the stabilizing circuitry 122B is again coupled to a compensation node of the force amplifier or buffer 102 and comprise a resistor-capacitor network such as described in FIG. 1A above.

Referring back to FIG. 1B, the resistor-capacitor network of the stabilizing circuitry 122B can include a single capacitor 140 (e.g. a 1 nF capacitor) that can be selectively connected to one or more of resistors $R_1$ 134 and $R_2$ 136. As in the example of FIG. 1A, the stabilizing circuitry 122A and 122B can operate to switch the fee-forward capacitor 126 in and out of the circuit by opening and closing force voltage switches 116 and 118 or force current switches 112 and 114. As an illustrative example, $R_1$ 134 may be 800 Ohms and $R_2$ 136 may be 50 Ohms. In another example capacitor 140 may be switchably connected in parallel with $R_1$ 134 and $R_2$ 136. The circuit may also include voltage clamp 152, which can push or pull current into the compensation node of the force amplifier or buffer 102 if the voltage across the DUT 104 exceeds a selected limit, and a current clamp 154 which can push or pull current into the compensation node of the force amplifier or buffer 102 if a current through the DUT 104 exceeds a selected limit.

When the circuit is operating in force current mode, $R_2$ 136 may be switchably or selectively connected to the resistor-capacitor network via switch 144. Alternatively, or in addition, $R_2$ 136 may be switchably or selectively connected to the resistor-capacitor network via switch 144 when the current clamp 154 is triggered. In another example, when the circuit is operating in force voltage mode, $R_1$ 134 may be switched into the resistor-capacitor network using switch 142 of the stabilizing circuitry 122A and 122B. Alternatively, or in addition, $R_1$ 134 may be switched into the resistor-capacitor network using switch 142 when the voltage clamp 152 is triggered. Connecting the pre-charged feed-forward capacitor 126 to the stabilizing circuitry 122A or 122B may reduce, inhibit, or otherwise minimize or eliminate voltage spikes or other similar glitches which may occur when switching between operating modes, which may damage or otherwise degrade the performance of the DUT 104.

In an example, a current monitor or a voltage monitor may be connected to the DUT 104, to monitor the voltage level across, or the current level through the DUT 104, and control the compensation node of the force amplifier 102 to activate the stabilizing circuitry 122A and 122B.

Figure 2:
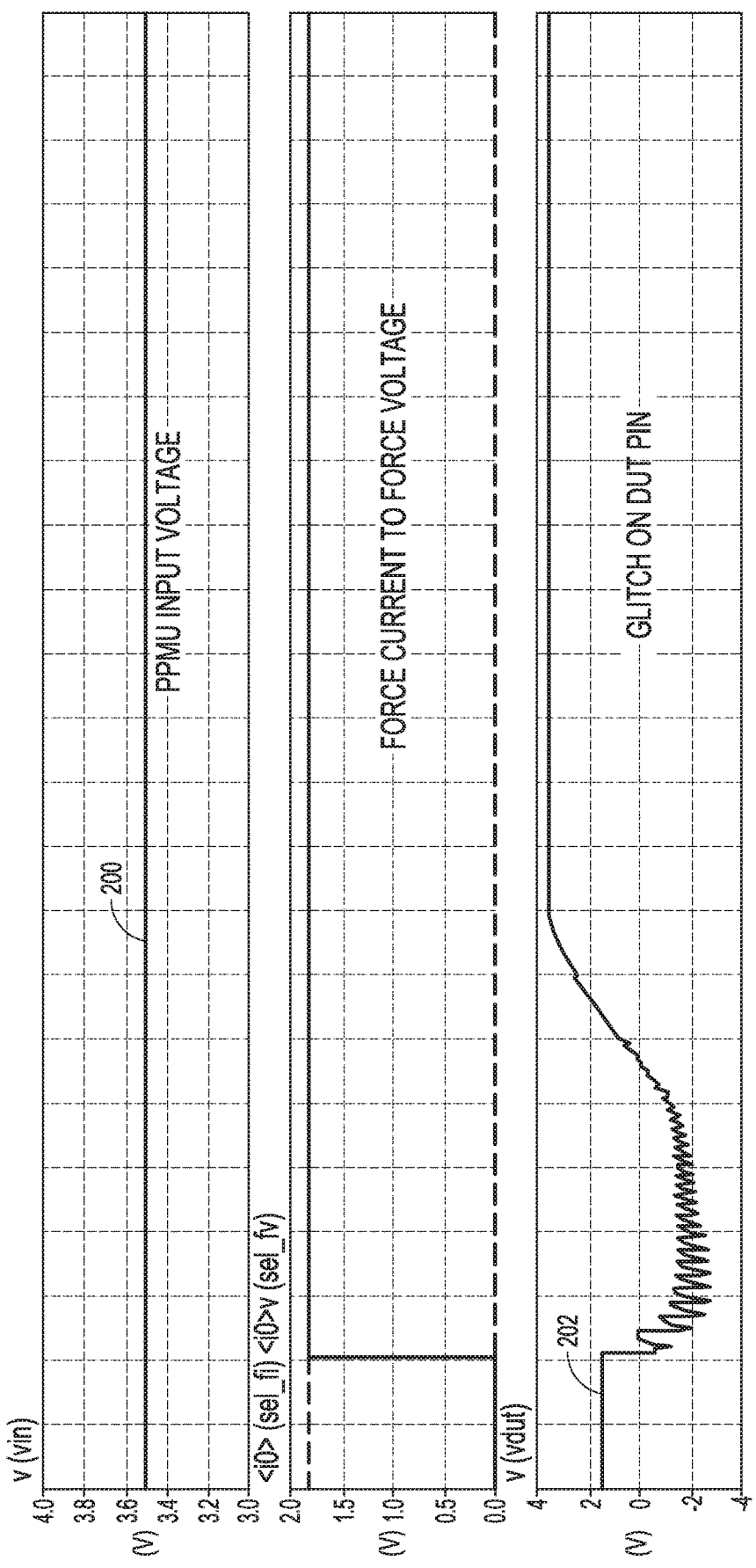
FIG. 2 comprises an illustrative example of a simulation showing a voltage at a node of a device under test (DUT) during mode switching from a force current mode to a force voltage mode of a PPMU without stabilizing circuitry and pre-charge circuitry.

FIG. 2 comprises an illustrative example of a simulation showing a voltage at a node of a device under test (DUT) during mode switching from a force current mode to a force voltage mode of a PPMU without stabilizing circuitry and pre-charge circuitry. For example, an input voltage 200 (e.g. 3.5 Volts) is delivered to the PPMU (e.g. using the multiplexer 100 in FIG. 1A or FIG. 1B). When the system switches from a force-current to force-voltage mode, a DUT voltage 202 may be generated for delivery to the DUT 104 (e.g. delivered to a pin of the DUT 104).

As shown at the bottom of FIG. 2, said DUT voltage 202 may include a glitch (e.g. a ringing or oscillation), which may be caused by a capacitor (e.g. feed-forward capacitor 126) left floating (e.g. without reverse butler 126 coupled to the feed-forward capacitor 126). The DUT voltage 202 may experience a monotonic change as it approaches a final value, corresponding to the input voltage 200. As shown and described in relation to the techniques herein and in the illustrative example of FIG. 3 below, the glitch in the DUT voltage 202 shown in FIG. 2 may be at least one of reduced, inhibited, or minimized, by the addition of the pre-charge circuitry 124 and the stabilizing circuitry 122A or 122B as shown and described in FIG. 1A and FIG. 1B above (e.g. by using the reverse buffer 128 to pre-charge the teed-forward capacitor 126).

Figure 3:
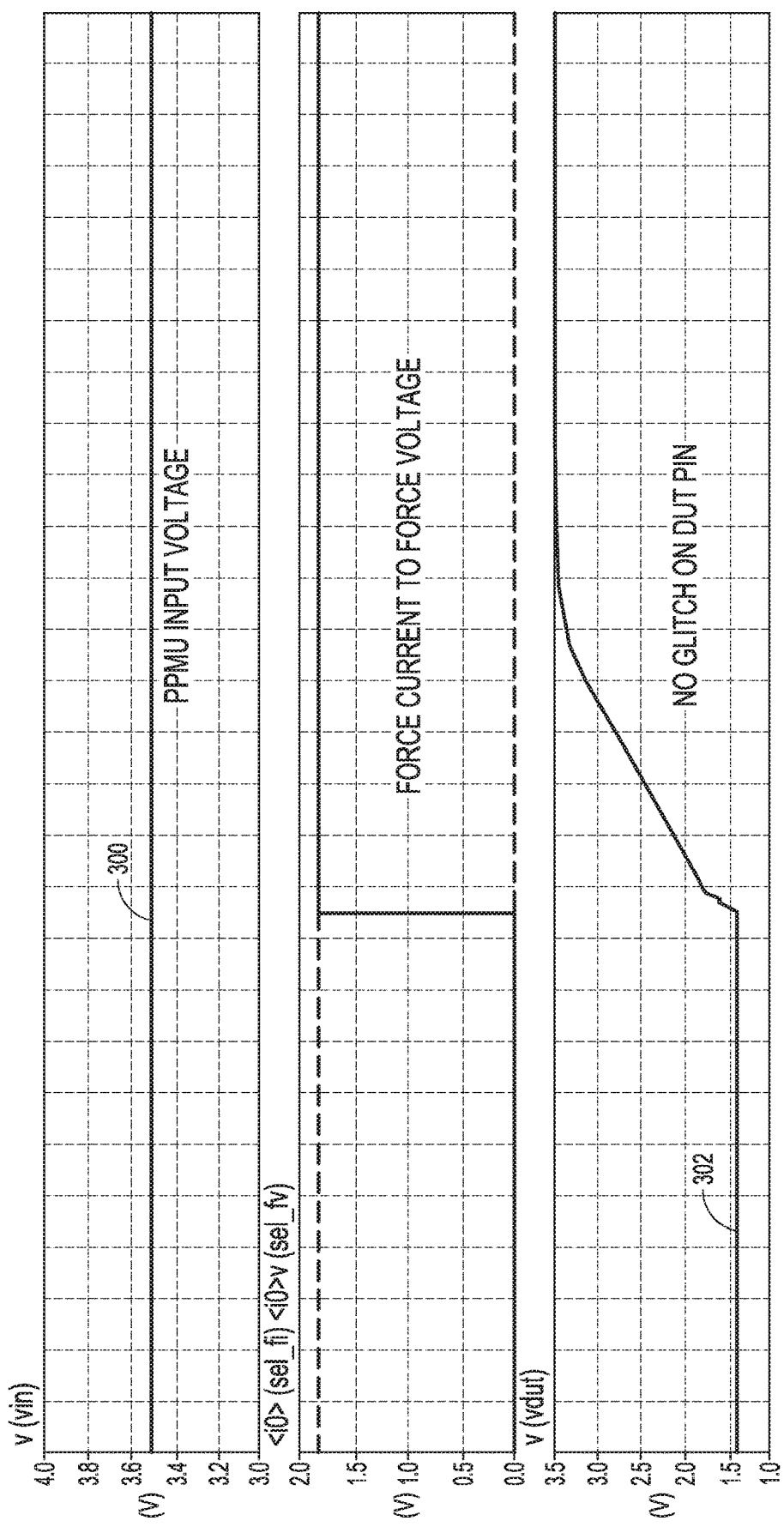
FIG. 3 comprises an illustrative example of a simulation showing a voltage at a node of a device under test (DUT) during mode switching from a force current mode to a force voltage mode of a PPMU, and by contrast with the illustrative example of FIG. 2, the simulation corresponds to a PPMU with stabilizing circuitry and pre-charge circuitry.

FIG. 3 comprises an illustrative example of a simulation showing a voltage at a node of a device under test (DUT) during mode switching from a force current mode to a force voltage mode of a PPMU, and by contrast with the illustrative example of FIG. 2, the simulation corresponds to a PPMU with stabilizing circuitry and pre-charge circuitry. For example, an input voltage 300 (e.g. 3.5 Volts) may be input to the PPMU circuit, such as, for example, via the multiplexer 100. When the circuit switches from force current to force voltage mode, a DUT voltage 302 may be delivered to a pin of the DUT 104 as described in FIG. 2 above. In the example of FIG. 3, the pre-charge circuitry 124 and the stabilizing circuitry 122A and 122B as described for FIG. 1A or FIG. 1B above may be utilized to keep the feed-forward capacitor 126 charged using the reverse buffer 128.

In the example of FIG. 3, when the feed-forward capacitor 126 remains charged, the DUT voltage 302 may increase from an initial value (e.g. 1.5 Volts) to a final value (e.g. 3.5 Volts) without the ringing or oscillation caused by a glitch on a pin of the DUT 104 as shown and described for FIG. 2 above. Hence, adding the pre-charge circuitry 124 and the stabilizing circuitry 122A or 122B may reduce, inhibit, minimize, eliminate, or the like, a glitch on the DUT 104 during mode switching (e.g. provide for monotonic switching) or when actively clamping voltage or current as described above.

Figure 4:
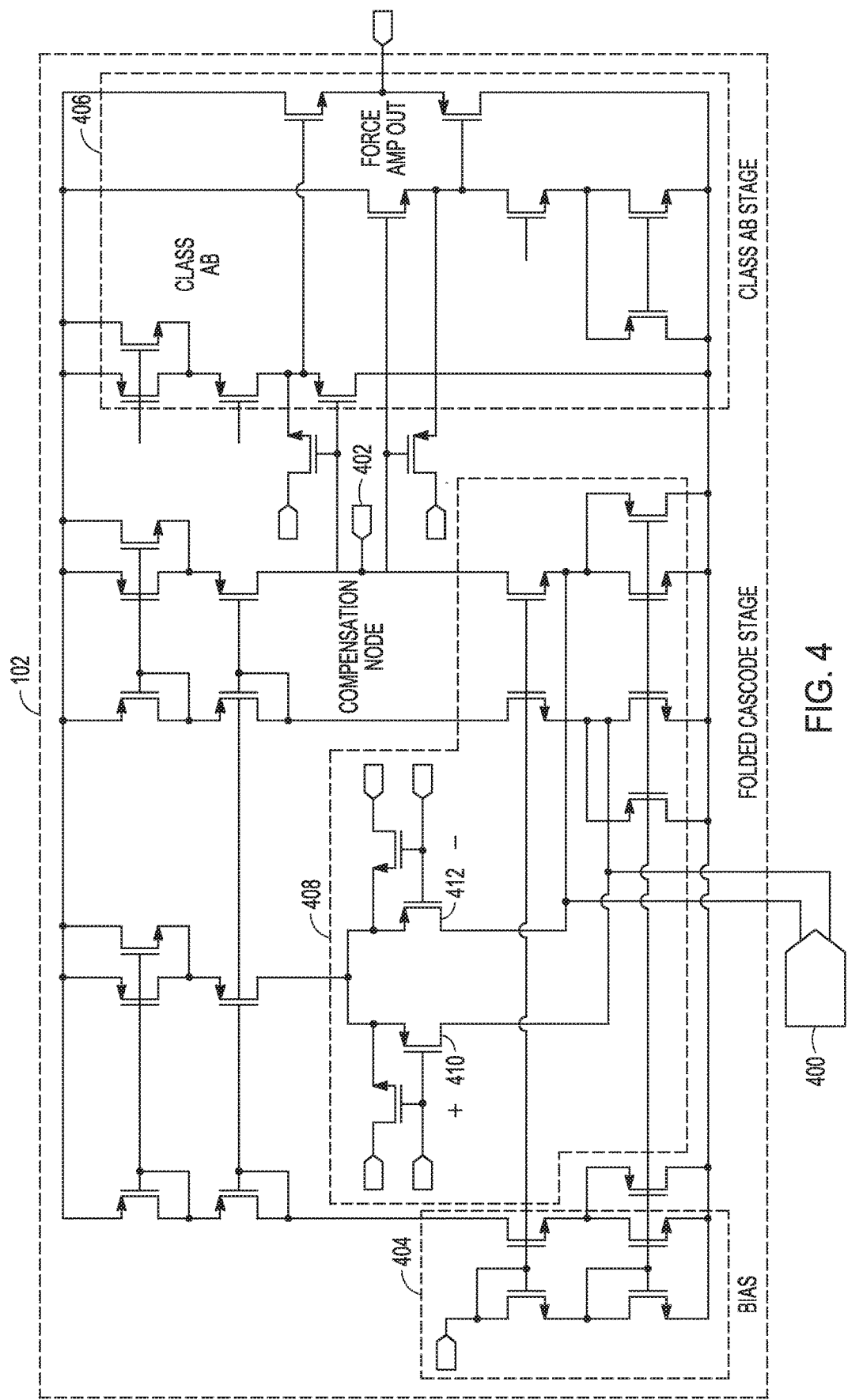
FIG. 4 illustrates an example circuitry, such as can be coupled to a per-pin measurement unit (PPMU) or included as a portion of a PPMU, the circuitry comprising a force amplifier with stabilizing circuitry connected to a compensation node of the force amplifier.

FIG. 4 illustrates an example circuitry, such as can be coupled to a per-pin measurement unit (PPMU) or included as a portion of a PPMU, the circuitry comprising a force amplifier with stabilizing circuitry connected to a compensation node of the force amplifier. In an example, the stabilizing circuitry 122A or 122B (as shown and described in FIGS. 1A and 1B above) may be connected to a compensation node 402 of the force amplifier or buffer 102. The compensation node 402 may be included in the force amplifier or buffer 102 between an input first stage (e.g. a bias stage 404) and a second output stage (e.g. a class A/B stage 406), such as, for example, in a folded cascode stage 408, of the force amplifier or buffer 102. The compensation node 402 may set the dominant pole and control the response of the system (e.g. closing force voltage switches 116 and 118 when voltage clamping is activated). An offset trimming digital to analog converter (DAC) 400 may be connected to transistors 410 and 412 forming an input differential pair, in the folded cascode stage 408 to reduce or otherwise minimize offset errors.

An advantage of using a multi-stage amplifier or buffer as the force amplifier or buffer 102 may include the ability to provide sufficient gain, or impedance matching, above or beyond what may be achieved using a single stage amplifier or buffer. While FIG. 4 shows an example of using a cascode stage 408 between a bias stage 404 and a class A/B stage 406, other multi-stage amplifiers or buffers may be utilized such as, for example, a common-emitter/common-collector cascade, coupled common-emitter stages, complimentary pairs, or the like. Further, multiple multi-stage amplifiers or buffers may be connected to achieve a similar result.

Figure 5:
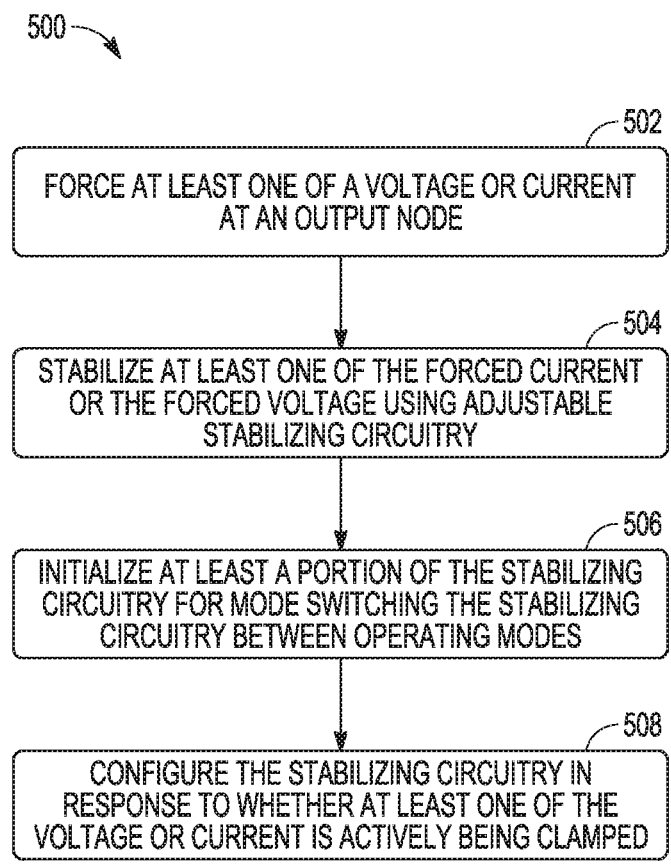
FIG. 5 illustrates an example comprising a technique, such as a method for forcing a voltage or a current delivered to an output node, such as conductively coupled to a device under test (DUT), and measuring the other of the voltage or current at the DUT.

FIG. 5 illustrates an example comprising a technique, such as a method for forcing a voltage or a current delivered to an output node, such as conductively coupled to a device under test (DUT), and measuring the other of the voltage or current at the DUT. At 502 at least one of a voltage or a current can be established or forced at an output node, such as 150 in FIG. 1A or FIG. 1B above, coupled to a device under test, such as 104 in FIG. 1A or FIG. 1B. Thus, the voltage or current at the DUT 104 may be measured to determine whether the DUT 104 is operating within a specified parameter.

At 502 the multiplexer 100 in FIG. 1A or FIG. 1B coupled to the force amplifier or buffer 102 may allow different values of current (e.g. 2 μA to 40 mA) or voltage (e.g. −1.5 volts to 6.6 volts) to be driven to the output node 150 and the DUT 104.

At 504 at least one of the forced current or the forced voltage can be stabilized using adjustable stabilizing circuitry (such as 122A or 122B as described in FIG. 1A or FIG. 1B). This may be done in response to whether at least one of current clamping or voltage clamping is occurring at the output node 150. For example, the stabilizing circuitry 122A or 122B may be used to switch the feed-forward capacitor 126 as a part of the pre-charge circuitry 124, in or out of the circuit during at least one of: (1) a force voltage operating mode or (2) a force current operating mode in which voltage clamp 152, is in an active clamping mode.

At 506 at least a portion of the stabilizing circuitry may be stabilized between operating modes. 508 may include, for example, configuring the stabilizing circuitry in response to whether at least one of the voltage or current is actively being clamped. 504, 506, and 508 may be interrelated using the circuitry making up the compensation network 120, the pre-charge circuitry 124, and the stabilizing circuitry 122A or 122B in FIG. 1A or FIG. 1B. For example, the pre-charge circuitry 124 may include the feed-forward capacitor 126, the reverse buffer, 128, force current switch 112, or force voltage switch 116. In another example, the pre-charge circuitry 124 may include a capacitor coupled to a resistor (not shown) or an inductor (not shown) or a capacitor-resistor-inductor network (not shown). In an example, when the system is operating in the force current mode, force current switches 112 and 114, connected to a force current circuit is closed and force voltage switches 116 and 118 are open, charging the feed-forward capacitor 126. Responsive to the voltage being clamped, the force current switches 112 and 114 are opened and force voltage switches 116 and 118 close connecting the capacitor to the stabilizing circuitry. While the voltage is clamped, the reverse buffer 128 may charge the feed-forward capacitor 126 such that when the circuit switches modes, it may reduce, inhibit, or minimize a voltage spike or similar glitch on the DUT 104 as shown and described in FIG. 2 above.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

What is claimed is:

1. A test system for forcing a voltage or a current delivered to an output node for coupling to a device under test (DUT) and measuring the other of the voltage or current at the DUT, the system comprising:
 a force voltage circuit, including or coupled to a voltage feedback path and a current clamp;
 a force current circuit, including or coupled to a current feedback path and a voltage clamp; and
 adjustable stabilizing circuitry, coupled to at least one of the force voltage circuit or the force current circuit, the stabilizing circuitry adjustably configurable in response to whether at least one of the current clamp or the voltage clamp is operating in an active clamping mode.

2. The system of claim 1, comprising a precharge circuit configured to initialize at least a portion of the stabilizing circuitry for mode switching the stabilizing circuitry between operating modes.

3. The system of claim 2, wherein the precharge circuit includes a capacitor and a reverse buffer to charge the capacitor based on a voltage at the output node.

4. The system of claim 1, wherein the adjustable stabilizing circuitry includes a compensation network that is switched in during at least one of: (1) a force voltage operating mode or (2) a force current operating mode in which the voltage clamp is operating in an active clamping mode.

5. The system of claim 4, wherein the compensation network includes a feedforward capacitor.

6. The system of claim 1, wherein the adjustable stabilizing circuitry includes a switched resistor-capacitor network coupled to a compensation node of an amplifier or buffer circuitry used to force voltage at the output node or to force current at the output node.

7. The system of claim 6, wherein responsive to the current clamp activating, a first switch closes connecting a first resistor to a capacitor in the switched resistor-capacitor network.

8. The system of claim 6, wherein responsive to the voltage clamp activating, a second switch closes connecting a second resistor to a capacitor in the switched resistor-capacitor network.

9. The system of claim 6, wherein the compensation node is included in the amplifier or buffer and connected between an input stage of the amplifier or buffer and an output stage of the amplifier or buffer.

10. A test system for forcing a voltage or a current delivered to an output node for coupling to a device under test (DUT) and measuring the other of the voltage or current at the DUT, the system comprising:
 a force voltage circuit, including a voltage feedback path and a current clamp;
 a force current circuit, including a current feedback path and a voltage clamp;
 a compensation network; and
 a precharge circuit, configured to initialize the compensation network for mode switching the compensation network between operating modes.

11. The system of claim 10, wherein the compensation network is configurable in response to whether at least one of the current clamp or the voltage clamp is operating in an active clamping mode.

12. The system of claim 10, wherein the compensation network includes adjustable stabilizing circuitry which is switched in during at least one of: (1) a force voltage operating mode or (2) a force current operating mode in which the voltage clamp is operating in an active clamping mode.

13. The system of claim 12, wherein the precharge circuit includes a reverse buffer connected to a feedforward capacitor to at least one of reduce, inhibit, or minimize voltage spikes caused by switching between operating modes.

14. The system of claim 10, wherein the compensation network includes a switched resistor-capacitor network coupled to a compensation node of an amplifier or buffer circuitry used to force voltage at the output node or to force current at the output node.

15. The system of claim 14, wherein responsive to the current clamp activating, a first switch closes connecting a first resistor to a capacitor in the switched resistor-capacitor network.

16. The system of claim 14, wherein responsive to the voltage clamp activating, a second switch closes connected a second resistor to a capacitor in the switched resistor-capacitor network.

17. The system of claim 14, wherein the compensation node is included in the amplifier or buffer between an input first stage and an output second stage.

18. A method for forcing a voltage or a current delivered to an output node for coupling to a device under test (DUT) and measuring the other of the voltage or current at the DUT, the method comprising:
 forcing one of a voltage or a current at the output node; and
 stabilizing at least one of the forced current or the forced voltage using adjustable stabilizing circuitry in response to whether at least one of voltage clamping or current clamping is occurring at the output node.

19. The method of claim 18, further comprising:
 initializing at least a portion of the stabilizing circuitry for mode switching the stabilizing circuitry between operating modes.

20. The method of claim 19, further comprising:
 configuring the stabilizing circuitry in response to whether at least one of the voltage or the current is actively being clamped.

* * * * *